(12) United States Patent  
Cathelin et al.

(10) Patent No.: US 7,696,844 B2  
(45) Date of Patent: Apr. 13, 2010

(54) FILTERING CIRCUIT FITTED WITH ACOUSTIC RESONATORS

(75) Inventors: Andreia Cathelin, Laval (FR); Stéphane Razafimandimby, Grenoble (FR); Andreas Kaiser, Villeneuve d'Ascq (FR)

(73) Assignee: STMicroelectronics SA, Montrouge (FR)

(*) Notice: Subject to any disclaimer, the term of this patent is extended or adjusted under 35 U.S.C. 154(b) by 244 days.

(21) Appl. No.: 11/829,549

(22) Filed: Jul. 27, 2007

(65) Prior Publication Data

US 2008/0024244 A1    Jan. 31, 2008

(30) Foreign Application Priority Data

Jul. 28, 2006    (FR) .................................. 06 06919

(51) Int. Cl.  
H03H 9/54    (2006.01)

(52) U.S. Cl. ....................................... 333/190; 333/189

(58) Field of Classification Search ................... 333/190  
See application file for complete search history.

(56) References Cited

U.S. PATENT DOCUMENTS

| | | | |
|---|---|---|---|
| 3,697,903 A | 10/1972 | Sauerland | |
| 5,036,299 A | 7/1991 | Dick et al. | ..................... 331/25 |
| 5,043,681 A | 8/1991 | Tanemura et al. | ........... 331/107 |
| 5,235,640 A | 8/1993 | Devries et al. | ................ 380/13 |
| 5,446,306 A | 8/1995 | Stokes et al. | |
| 5,608,360 A | 3/1997 | Driscoll | ................... 331/107 A |
| 5,714,917 A | 2/1998 | Ella | |
| 6,653,913 B2 | 11/2003 | Klee et al. | |
| 6,917,789 B1 | 7/2005 | Moloudi et al. | |
| 6,950,639 B2 | 9/2005 | Gogolla et al. | ........... 455/196.1 |
| 7,030,718 B1 | 4/2006 | Scherer | ...................... 333/188 |
| 7,065,331 B2 | 6/2006 | Korden et al. | |

(Continued)

FOREIGN PATENT DOCUMENTS

DE          10234685          2/2004

(Continued)

OTHER PUBLICATIONS

De Los Santos, H., FR MEMES Circuit Design for Wireless Communications, "5.3 Film Bulk Acoustic Wave Filters," Artech House, 2002, pp. Cover-IV and 163-167.

(Continued)

*Primary Examiner*—Robert Pascal  
*Assistant Examiner*—Alan Wong  
(74) *Attorney, Agent, or Firm*—Lisa K. Jorgenson; E. Russell Tarleton; Seed IP Law Group PLLC

(57) ABSTRACT

A filtering circuit based on a lattice structure comprising a first and a second input and a first and second output. The circuit further comprises two series impedance and two parallel impedance which each comprises an acoustic resonator associated with two inductive and capacitive components which can be adjusted by a first control value. The second and fourth impedance comprise each an acoustic resonator associated to two inductive and capacitive components which are adjustable by means of a second control value. A control circuit generates the two control values which simultaneously comprise a common mode potential and a differential mode potential which allows the emergence of first and second pass bands which are usable for realizing two different bandpass filters.

27 Claims, 8 Drawing Sheets

U.S. PATENT DOCUMENTS

| | | | |
|---|---|---|---|
| 7,135,940 | B2 | 11/2006 | Kawakubo et al. |
| 7,187,240 | B2 | 3/2007 | Cathelin et al. |
| 7,194,247 | B2 * | 3/2007 | Tikka et al. ............ 455/339 |
| 7,218,181 | B2 | 5/2007 | Razafimandimby et al. |
| 7,274,274 | B2 | 9/2007 | Carpentier et al. |
| 7,319,371 | B2 | 1/2008 | Ten Dolle et al. |
| 7,345,554 | B2 | 3/2008 | Cathelin et al. |
| 2001/0028277 | A1 | 10/2001 | Northam ............ 331/34 |
| 2004/0227578 | A1 | 11/2004 | Hamalainen ............ 331/107 |
| 2005/0266823 | A1 | 12/2005 | Cathelin et al. ............ 455/344 |

FOREIGN PATENT DOCUMENTS

| | | |
|---|---|---|
| FR | 2455816 | 11/1980 |
| FR | 2764733 | 7/2005 |
| FR | 2864726 | 7/2005 |
| FR | 2864728 | 7/2005 |
| FR | 2864728 | 7/2005 |
| GB | 615 841 | 1/1949 |
| JP | 10-294636 | 11/1998 |
| WO | 02/25813 | 3/2002 |
| WO | 2004/066495 | 8/2004 |

OTHER PUBLICATIONS

Vale, G., et al., "FBAR Filters at GHz Frequencies," Forty-Fourth Annual Symposium on Frequency Control, Westinghouse Electric Corp., IEEE, 1990, pp. 332-336.

Bradley, P., et al., "A Film Bulk Acoustic Resonator (FBAR) Duplexer for USPCS Handset Applications," IEEE MTT-Symposium, pp. 367-370, 2001.

Carpentier, J. F., et al., "21.3—A SiGe:C BiCMOS WCDMA Zero-IF RF Front-End Using an Above-IC BAW Filter," IEEE International Solid-State Circuits Conference, pp. 394-395, 2005.

Carpentier, J. F., et al., "A Tunable Bandpass BAW-Filter Architecture and Its Application to WCDMA Filter," IEEE MTT-Symposium, pp. 221-224, 2005.

Gopinathan, V., et al., "Design Considerations for High-Frequency Continuous-Time Filters and Implementation of an Antialiasing Filter for Digital Video," IEEE Journal of Solid-State Circuits, vol. 25, No. 6, pp. 1368-1378, Dec. 1990.

Karsilayan, A., et al., "Automatic Tuning of Frequency and Q-Factor of Bandpass Filters Based on Envelope Detection," ISCAS '98, Proceedings of the 1998 IEEE International Symposium on Circuits and Systems, pp. 65-68, 1998.

Lakin, K. M., et al., "Improved Bulk Wave Resonator Coupling Coefficient for Wide Bandwidth Filters," IEEE Ultrasonics Symposium, pp. 827-831, 2001.

Li, D., et al., "Design Techniques for Automatically Tuned Integrated Gigahertz-Range Active LC Filters," IEEE Journal of Solid-State Circuits, vol. 37, No. 8, pp. 967-977, Aug. 2002.

Razafimandimby, S., et al. "A Novel Architecture of a Tunable Bandpass BAW-filter for a WCDMA Transceiver," Analog Integr. Circ. Sig. Process, vol. 49, pp. 237-247, 2006.

Schmidhammer, E., et al., "Design Flow and Methodology on the Design of BAW Components," IEEE MTT-Symposium, pp. 233-236, 2005.

Tilhac, C., et al., "A Bandpass BAW-Filter Architecture with Reduced Sensitivity to Process Variations," IEEJ Analog VLSI Workshop 2005, 5 pages.

Ueda, M., et al., "High-Q Resonators Using FBAR/SAW Technology and their Applications," IEEE MTT-Symposium, pp. 209-212, 2005.

Akbari-Dilmaghani, R., et al., "A High Q RF CMOS Differential Active Inductor," in Proceedings of the IEEE Electronics, Circuits and Systems Int'l. Conference, Lisbon, Portugal, Sep. 7-10, 1998, pp. 157-160.

Koroglu, M., et al., "A 1.9Ghz Image-Reject Front-End with Automatic Tuning in a 0.15 µm CMOS Technology," in Proceedings of the IEEE Int'l. Solid State Circuits Conference, San Francisco, CA, Feb. 9-13, 2003, pp. 1-10.

Razafimandimby, S., et al., "Nouvelle Configuration de filtre RF accordable en frequence utilisant des resonateurs BAW pour une chaine de reception homodyne WCDMA," 6e Colloque TAISA 2005, 4 pages.

* cited by examiner $$H = \frac{(Z_s - Z_p)}{(Z_s + Z_p)}$$

FILTERING CIRCUIT FITTED WITH ACOUSTIC RESONATORS

TECHNICAL FIELD

The present disclosure generally relates to telecommunications and more particularly but not exclusively to a filtering circuit based on acoustic resonators capable of performing multiband processing.

BACKGROUND INFORMATION

The use of acoustic resonators is spreading widely in RF circuits used in the field of mobile telecommunications. Conventionally, one distinguishes between Surface Acoustic Resonator (SAW) and Bulk Acoustic Resonator (BAW). In SAWs, the acoustic resonator is located on the surface of a semiconductor product while, in BAWs, it lays inside a volume delimited between a lower electrode and a higher electrode so that the acoustic wave develops in this volume.

Because of their efficiency, acoustic resonators are frequently used in radio frequency (RF) filtering and in particular in mobile telephony.

FIG. 1 illustrates a first example of a known filtering circuit which is based on a lattice structure. The circuit comprises first and second series impedances Zs 100 and 200, and third and fourth parallel impedances Zp 300 and 400. Each series impedance Zs and parallel impedance Zp is embodied with an acoustic resonator, thereafter designated as a Tunable Resonator Component (TRC) such as described in U.S. patent application Ser. No. 11/025,599, entitled "INTEGRABLE ACOUSTIC RESONATOR AND METHOD FOR INTEGRATING SUCH RESONATOR," filed on Dec. 29, 2004, comprising a BAW type acoustic resonator associated with two partner elements, a varactor 2 and an inductor 3.

As it is known in the art, a BAW acoustic resonator is based on a dielectric medium arranged on a reflecting element, such as a Bragg mirror. Layers having different acoustic properties and different dielectric constants are stacked on a silicon substrate. Such an acoustic element is known as a Surface Mounted Resonator (SMR). Alternatively, the resonator could be of the Film Bulk Acoustic Resonator type (FBAR), namely a resonator located above a cavity to allow the reflection of acoustic waves and to avoid damping thereof.

A BAW resonator has two very close resonant frequencies, $f_s$ (series) and $f_p$ (parallel) respectively, as illustrated in FIG. 2B. In order to embody a Tunable Resonator Component based on an acoustic BAW resonator, one associates a BAW resonator with at least two partner elements and a first inductive type partner element (represented by inductor 3 in FIG. 2A) which is variable or fixed, active or passive, which resonates with the intrinsic capacity of the resonator (depending on the electrodes) in a range of frequencies located close to the series and parallel resonant frequencies. The second partner element is generally a capacitive type element (as illustrated by varactor 2 in FIG. 2A), which is made tunable according to an electric quantity, e.g., electric voltage $V_c$.

In the known arrangement which is illustrated in FIG. 2A, the electric voltage Vc is controlled so as to adjust the characteristics of the two impedances Zs and Zp as illustrated in FIG. 3, by slightly shifting the resonant and anti-resonant frequencies Fs and Fp for the purpose of achieving a bandpass filter as illustrated in FIG. 3. This permits the frequencies characteristics of the two impedances Zs and Zp to be adjusted.

The following references illustrate examples of the state of the art which is known in the field of filters based on BAW resonators, without any auxiliary passive components.

"High-Q Resonators using FBAR/SAW Technology and their Applications," M. Ueda et al., MTT-Symposium 2005;

"Design Flow and Methodology on the Design of BAW components," E. Schmidhammer et al., MTT-Symposium 2005.

The following references illustrate examples of the state of the art which is known in the field of the design of filters comprising a tunable circuitry for adjusting the central frequency of the BAW resonator.

"SiGe:C BiCMOS WCDMA Zero-IF RF Front-End Using An Above-IC BAW Filter," Carpentier J. F., Cathelin A., Tilhac C., et al., ISSCC 2005;

"A Tunable Bandpass BAW-Filter Architecture and its Application to WCDMA Filter," J. F Carpentier at al., MTT-Symposium 2005;

"Nouvelle configuration de filtre RF accordable en fréquence utilisant des résonateurs BAW pour une chaîne de réception homodyne WCDMA"_S. Razafimandimby et al., 6e Colloque TAISA 2005;

"*Bandpass BAW-Filter Architecture with Reduced Sensitivity to Process Variations,*" C. Tilhac, S. Razafimandlmby et al., 2005 IEEJ Analog VLSI Workshop.

The following references illustrate more particularly examples of the design of filters based on BAW type resonators, with auxiliary passive components:

"Improved bulk wave resonator coupling coefficient for wide bandwidth filters," Lakin, K. M.; Belsick, J.; McDonald, J. F.; McCanon, K. T.; Ultrasonics Symposium, 2001 IEEE.

"A Film Bulk Acoustic Resonator (FBAR) Duplexer for USPCS Handset Applications," P. Bradley, et al., MTT-Symposium, 2001.

The latest development in the field of mobile telecommunications leads to new needs.

When considering the design of a BAW type acoustic resonator capable of operating at a reduced frequency, such as 1 Ghz for instance, one has to realize a piezzo-electric layer with an increased width, what shows to be a tricky operation with the known manufacturing techniques.

One should take note of the increasing request of customers for multiband mobile telephones. One may recall that the operating frequency of the European GSM network is based on a 850 Ghz frequency in the United States, and 900 Mhz in Europe. For the DCS European standard, the frequency of 1800 Mhz has to be considered and the PCS American standard is based on the 1900 Mhz frequency. Therefore, when one wishes to design a multiband mobile telephone that is capable of operating in different countries in the world, it becomes necessary to use, either different selective filters dedicated to specific band and arranged with multiplexors, or RF filters capable of handling different bands of frequencies.

Conventionally, a multiband mobile telephone is based on the use of different specific filtering circuits, each circuit comprising his own acoustic resonators operating at a predetermined band as well as specific receiving circuits.

This known technique has the advantage of being simple to carry out but has the drawback of requiring different arrangements of BAW resonators in a same mobile telephone.

BRIEF SUMMARY

An embodiment provides a filtering circuit which permits different bands of frequencies to be processed with one single set of acoustic resonators.

An embodiment provides a filter based on acoustic resonators operating at a frequency near 1 Ghz with manufacturing techniques adapted for resonators conventionally suitable for frequencies about 2 Ghz.

Another embodiment allows the use of a BAW type resonator which is originally designed for an operating frequency of about 2 Ghz, in a range of frequencies centered at a value being approximately half of the original frequency.

Another embodiment provides a RF filtering circuit, fitted with acoustic resonators, which allows the processing of different distinct bands of frequencies.

An embodiment of a filtering circuit is based on a lattice structure comprising a first and a second input and a first and second output. The circuit further comprises two series impedance Zs and two parallel impedance Zp which each comprises an acoustic resonator associated with two inductive and capacitive components which can be adjusted by a first control value. The second and fourth impedance comprise each an acoustic resonator associated to two inductive and capacitive components which are adjustable by a second control value. A control circuit generates the two control values which simultaneously comprise a common mode potential and a differential mode potential, which allows emergence of a first and a second pass bands which are usable for realizing two different bandpass filters.

By performing an appropriate control of the differential mode, one can achieve a bandpass filtering within a range of frequencies being centered at a value being half the value of the conventional value of the BAW resonator, what provides a significant extension of the possibilities of RF filtering with the same component.

It is thus made possible to achieve a multi-band filtering circuit which is based on one single set of BAW resonators, what results in a significant decrease in the manufacturing costs of the filter.

In one embodiment, each impedance within the lattice structure comprises a BAW type resonator which is connected in parallel with an inductor and the two components are then connected in series with a varactor which is tunable by a control voltage.

Alternatively, each impedance is embodied in a dual structure, based on a BAW resonator connected in series with one inductor and the two components being then connected in parallel with one varactor which is tunable by a control voltage.

In one embodiment, the filtering circuit achieves the filtering of one particular channel within the GSM band and also achieves the filtering of the DCS standard band.

In another embodiment, the filtering circuit achieves the pass band filtering of a first band of frequencies corresponding a WCDM operating at 850 Ghz and also a second band of frequencies corresponding to a WCDM operating at 2.14 Ghz.

In another embodiment, the filtering circuit performs the filtering of a first band corresponding to the GPS standard at 1.5 Ghz and also performs the filtering of a second band corresponding to BLUETOOTH operating at 2.45 Ghz.

One embodiment of the invention is particularly but not exclusively adapted to the realization of a receiver for a multi-band mobile telephone.

BRIEF DESCRIPTION OF THE SEVERAL VIEWS OF THE DRAWINGS

Other features of one or more embodiments of the invention will best be understood by reference to the following detailed description when read in conjunction with the accompanying drawings.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 4A:
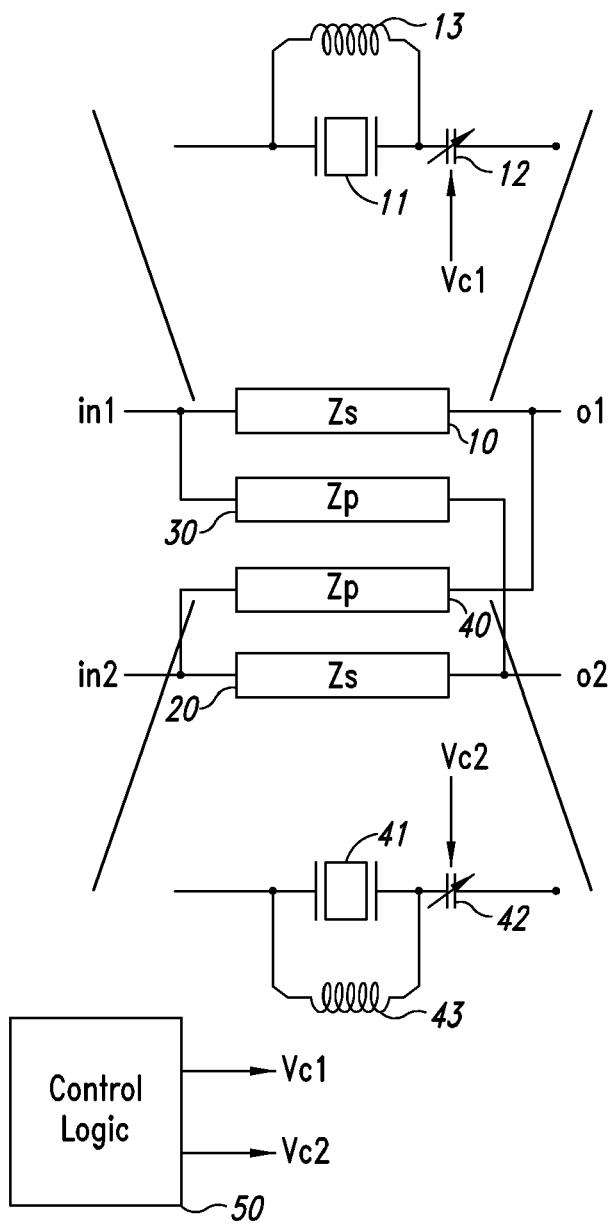
FIG. 4A illustrates a lattice filter according to one embodiment of the present invention achieving multi-band filtering and FIG. 4B illustrates an alternative embodiment thereof.
Figure 4B:
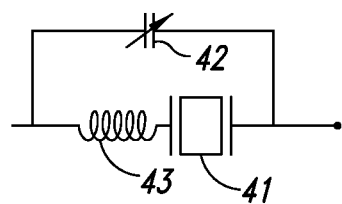

With respect to FIGS. 4A and 4B, there is now described one embodiment of a multi-band filtering circuit which extends the range of operating frequencies of BAW resonators of a given technology, for instance a conventional 2 Ghz technology, and which therefore can also be used in a second band of frequencies centered at a frequency value being half the value of the conventional, e.g., about 1 Ghz.

As it can be seen in FIG. 4A, the filtering circuit in accordance with an embodiment of the present invention is based on a lattice quadripole comprising first and second inputs, respectively IN1 and IN2, and first and second outputs, O1 and O2. The circuit comprises a first series impedance Zs 10 connected between input IN1 and output O1 and a second series impedance Zs 20 connected between input IN2 and output O2. Moreover, the circuit comprises a third impedance Zp which is connected in parallel between input IN1 and output O2 as well as a fourth impedance Zp connected in parallel between input IN2 and output O1.

In accordance with an embodiment of the present invention, each of the series impedances Zs 10 and 20 has first and second resonant frequencies, respectively f1 and f2. As it is known in the art, a resonant frequency results in the value of the impedance Zs to be minimal (ideally equal to 0 ohm)

Similarly, each of the parallel impedances 30 and 40 has third and fourth resonant frequencies, respectively f3 and f4.

Figure 5:
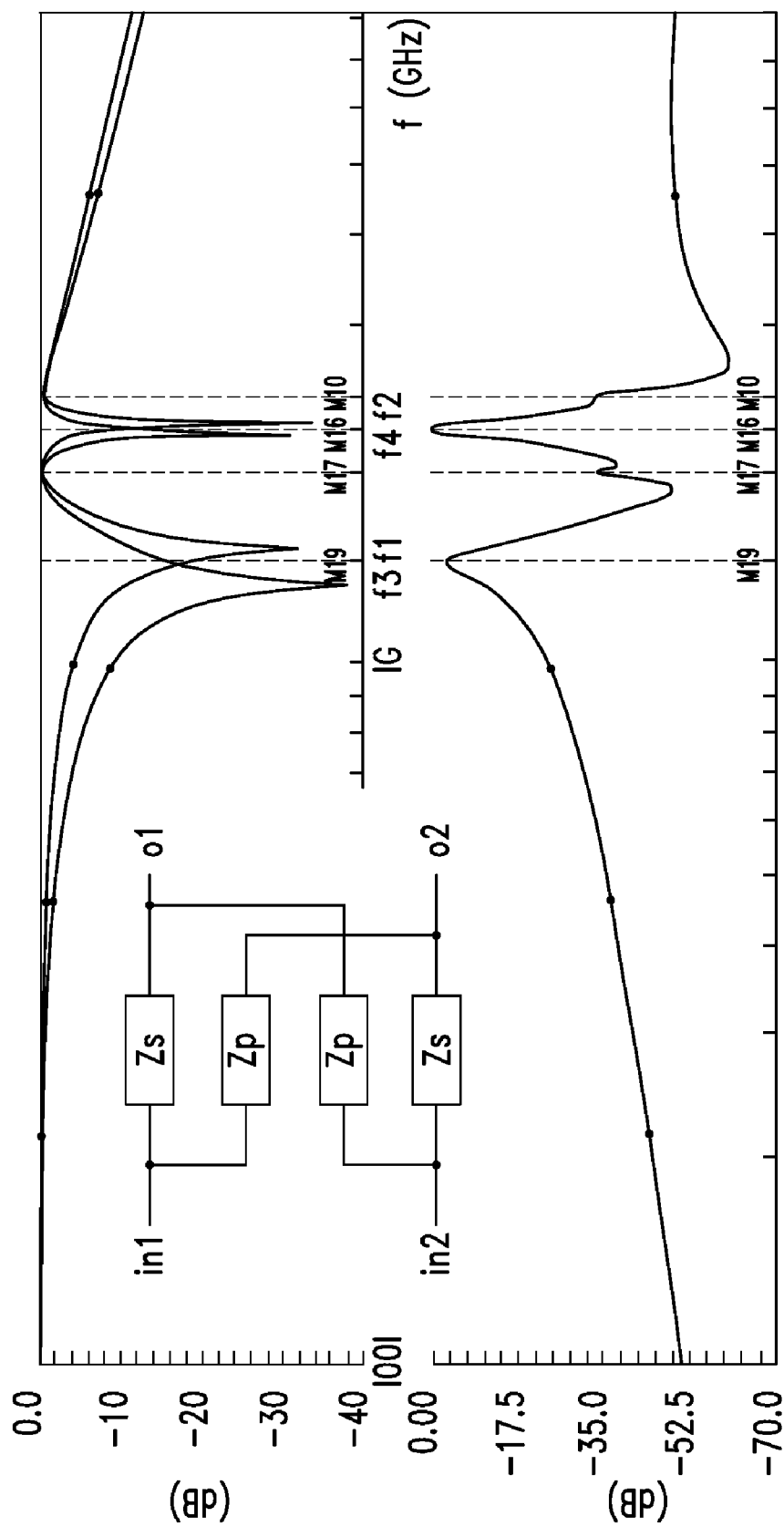
FIG. 5 illustrates an embodiment of a dual-band filter.

In order to carry out the filtering circuit of one embodiment of the present invention, one chooses the resonant frequencies f1 and f3 to be close to each other, as it is illustrated in FIG. 5 and, similarly, the second and fourth frequencies f2 and f4 are selected to be also close to each other, in a same neighborhood.

Figure 1:
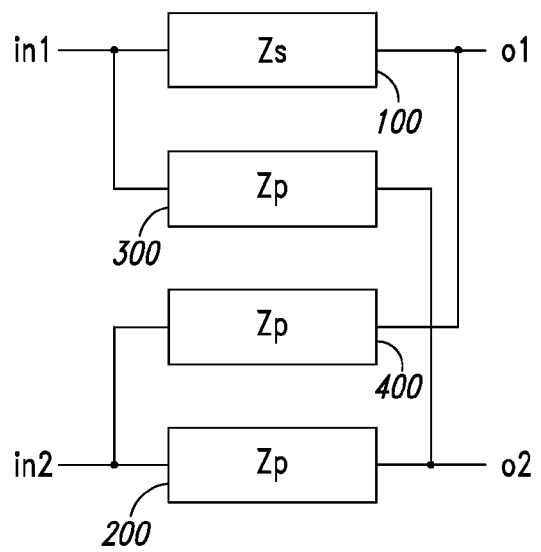
FIG. 1 illustrates the structure of a lattice filter comprising two series impedances Zs 100 and 200 and two parallel impedance Zp 300 and 400, and further illustrates the transfer function of such filter.
Figure 2A:
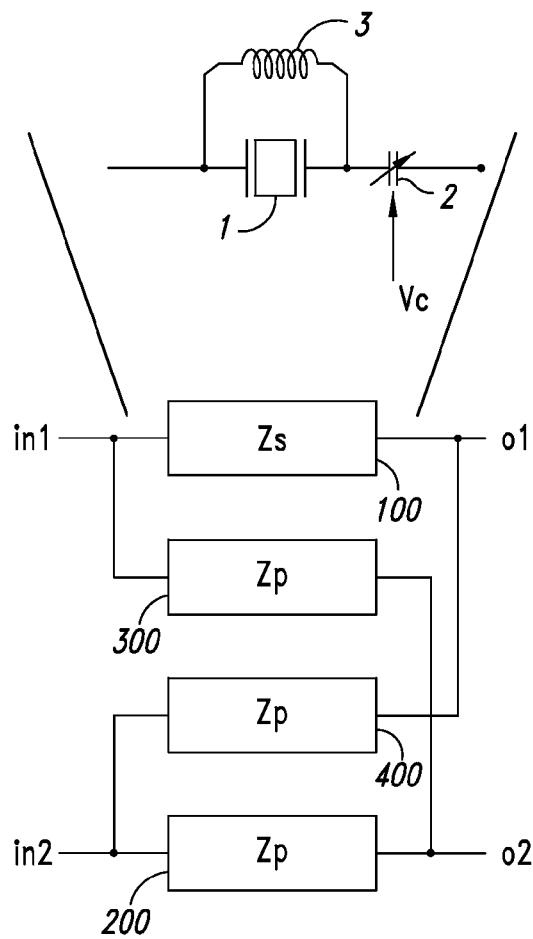
FIG. 2A illustrates a known lattice filter which comprises, for each of the series and parallel impedances, one BAW resonator associated with two partner elements for the purpose of realizing a bandpass filter.
Figure 2B:
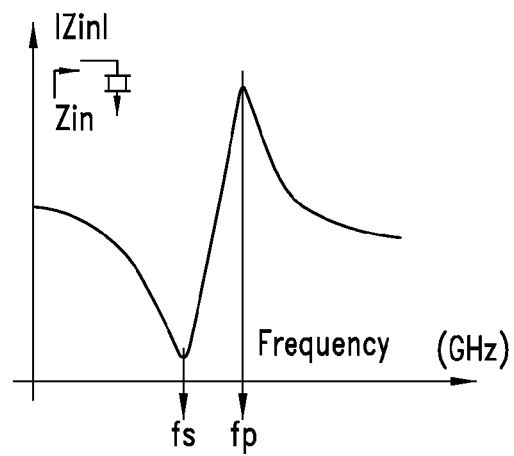
FIG. 2B illustrates the characteristics chart of a BAW type acoustic resonator, showing the resonant and anti-resonant frequencies.
Figure 3:
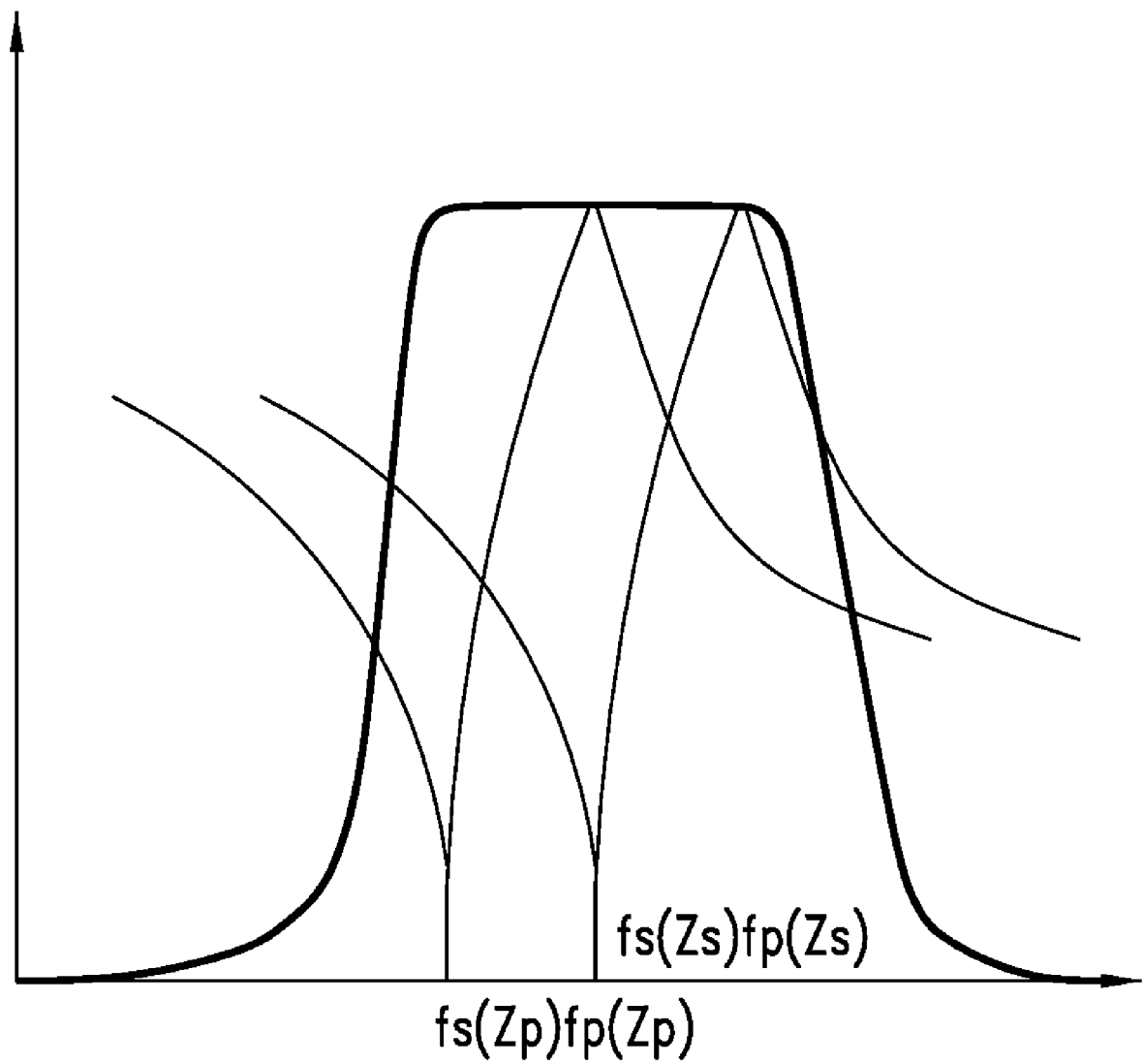
FIG. 3 illustrates the bandpass type transfer function obtained from the circuit of FIG. 2A.

By choosing impedances complying with the above mentioned conditions, it has been shown that, in the neighborhoods being considered, a maximum transmission is achieved since one may simultaneously have:
the same value of the modulus for Zs and Zp and,
a phase difference of about 180 degrees for the two impedances, what achieves an additive effect in the formula of the H transfer function illustrated in FIG. 1.

It has been noticed that, by arranging BAW type resonators, each being associated to two partner elements properly controlled in order to comply with the above mentioned conditions, it can be possible to have a second resonant frequency at a value which is significantly lower (approximately half the value) than the value of the conventional resonant frequency of the BAW resonator.

FIG. 4A illustrates more particularly one embodiment of impedances Zs and Zp. It can be seen that impedance Zs comprises a BAW resonator 11, to which is associated, in parallel, one inductor 13 being adjusted in order to enter into resonance with the parallel capacitor of that resonator, close to the frequency noted $f_p$ or in a close neighborhood of that frequency. One may then use the series frequency of the resonator by tuning the capacitor element based on varactor 12 controlled by a first control value, i.e., first control voltage Vc1.

In a similar way, impedance Zp comprises a BAW resonator 41 which is associated, in parallel, an inductor 43 and an adjustable capacitive element 42 being a varactor controlled by a second value, i.e., a control voltage Vc2.

A control circuit 50 generates the first and second control voltages Vc1 and Vc2 so as to introduce a differential mode Vx which is added to the common mode voltage applied to both varactors, so as to make appear a second resonant frequency for impedances Zs and Zp, that second frequency being in a range usable for achieving a band pass filtering circuit for about 1 Ghz.

It should be noticed that the embodiment which is illustrated is based on the use of the "series" frequency of the resonator. As it is known in the art, one can consider a dual structure based on the use of the "parallel" frequency and this can be achieved by using an inductor 43 in series with the BAW resonator 41 and, connected in parallel to the two serially connected resonator 41 and inductor 43, a capacitive adjustable component such as a varactor 42 tuned by a control voltage Vc1 or Vc2 (depending on the fact that Zs or Zp impedance is considered), as clearly shown in FIG. 4B. Clearly, such variations are straightforward and will not be further elaborated on.

FIG. 5 illustrates examples of the characteristics which can be obtained for impedances Zs and Zp embodied with Tunable Resonator Components properly controlled by control voltages Vc1 and Vc2 generated by control logic 50. Indeed, one may notice in the upper part of FIG. 5, and for each impedance Zp or Zs, the emergence of a second resonant frequency and one may also take note that the resonant frequencies are, two by two, located in a same neighborhood.

As it can be seen in the lower part of FIG. 5, one can advantageously use the additive effect relating to the H transfer function which was mentioned above and, therefore, the achievement of a bandpass filter which is capable of operating at a frequency value being half the conventional value of the BAW resonator.

This significant difference—about 1 Ghz—between the two bands of frequencies allows now to consider the realization of an arrangement of BAW resonators suitable for different bands and different applications in mobile telecommunication (although telecommunications is not the exclusive field of application of the present invention).

Figure 6:
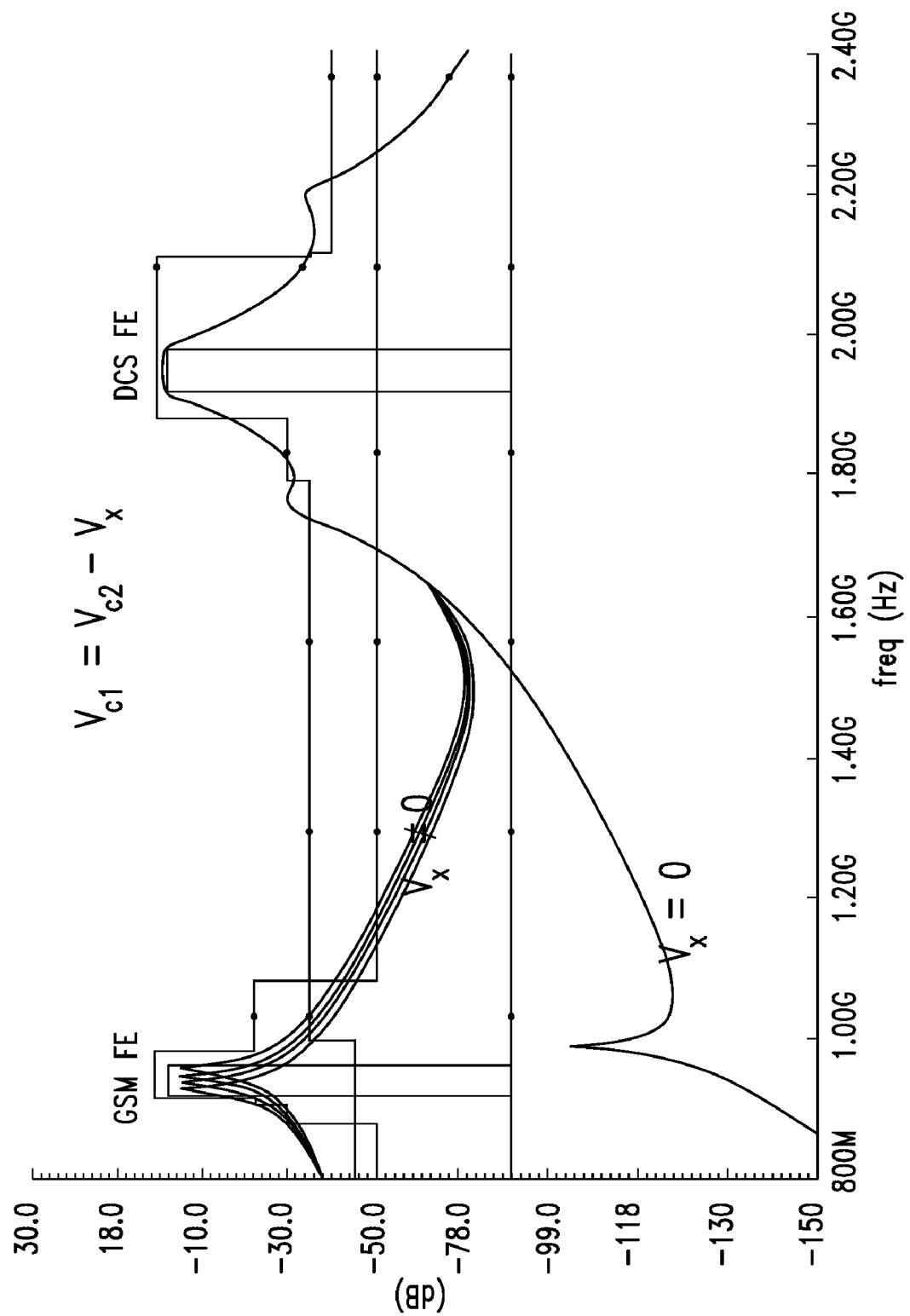
FIG. 6 illustrates a particular embodiment of the invention achieving a filtering circuit for one channel in the GSM band and for the whole DCS band.

FIG. 6 shows one specific embodiment of a lattice filtering circuit usable for filtering one channel within the GSM band (operating at 850 Mhz) and which is also usable for the American DCS standard.

At it is shown in FIG. 6, one controls the varactors of impedances Zs and Zp so as to introduce, on one hand, a common mode voltage (for instance Vc1) and also a differential mode voltage Vx as follows:

$$Vx=Vc2-Vc1$$

Whenever Vx=0, one observes that the filtering circuit of FIG. 4A only has one usable band which is centered near 2 Ghz and which, therefore, can process the DCS band.

On the axis of the frequencies, at a value being about half the value of the conventional frequency of the resonator, one sees the emergence of a "peak" at a not measurable level of about −90 dB and which is, therefore, not directly usable as such. In that situation where Vx=0, the filtering circuit of FIGS. 4A and 4B achieves the conventional one single bandpass filter.

However, and this is a surprising effect of one embodiment of the present invention, one also notices that when a differential mode Vx is applied (with a sufficient value), the level of the "peak" is significantly increased and emerges in a zone which is usable for considering a second band filtering function centered at a value which is approximately half the value of the preceding filtering band.

This second band shows to be compatible with the GSM band of frequencies.

At it can be seen, one can therefore achieve a filtering circuit comprising a set of BAW resonators which can be used for different bands of frequencies.

One may advantageously notice that a same BAW component can be used for a frequency which is significantly inferior than the conventional frequency for which it was designed and manufactured.

Therefore, and this is a first significant advantage of an embodiment of the invention, one can thus expand the range of frequencies usable for a given BAW resonator manufactured in accordance with a known manufacturing technique. This is likely to reduce the manufacturing costs of the resonators since the conventional manufacturing technique can be reused for more ranges of frequencies, even not exploited today.

Secondly, and this is also a significant advantage, it can be possible to directly use, by an appropriate control of the common and differential modes of voltages Vc1 and Vc2, the two bands which are usable by the same lattice filtering circuit.

As illustrated in FIG. 6, one can thus manufacture one unique filtering circuit complying with the GSM standard (operating at a frequency of 850 Mhz) and also with the DCS standard operating at 2 Ghz.

Figure 7:
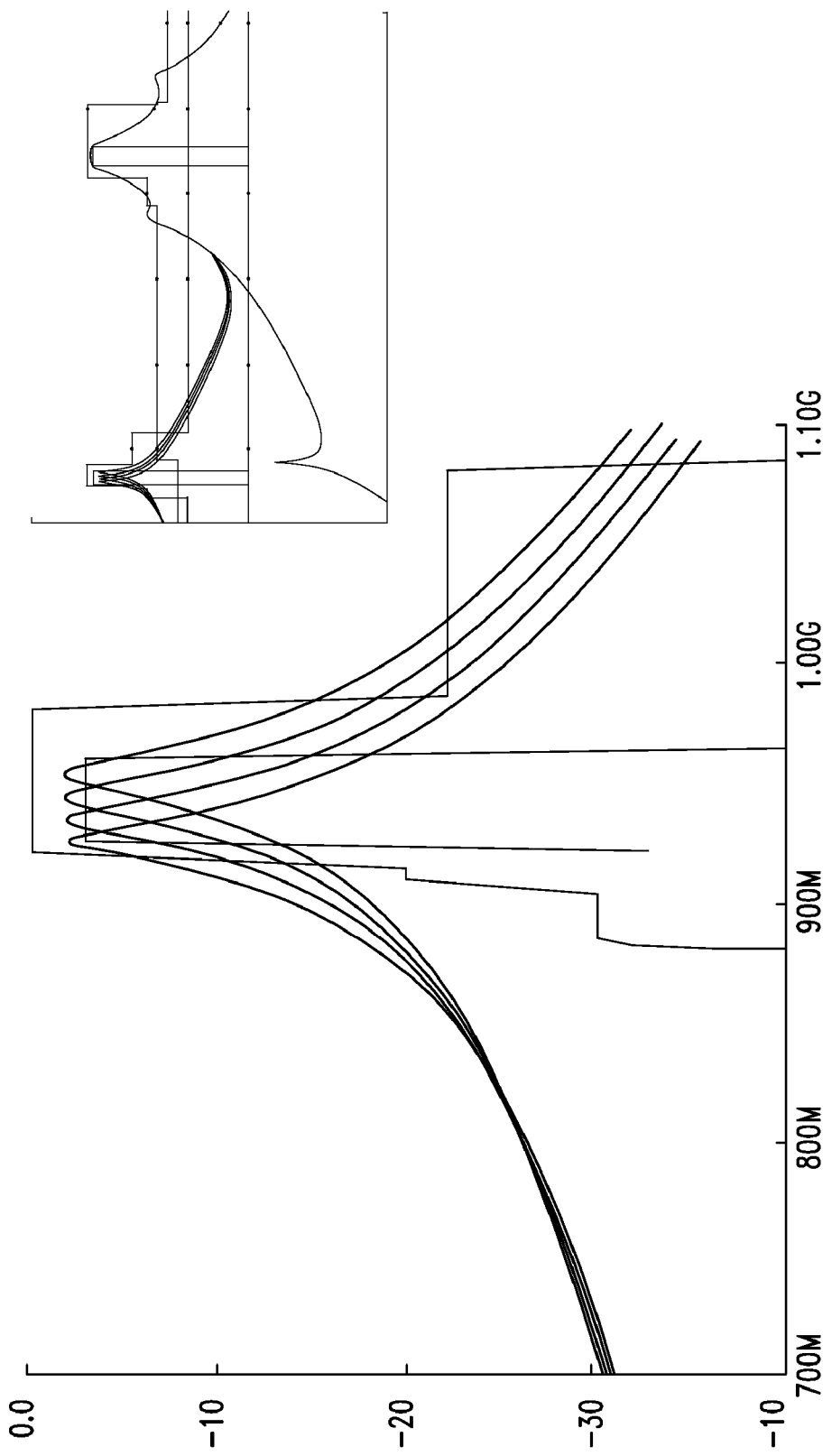
FIG. 7 more particularly illustrates the detail of the first pass band (GSM) of the filtering circuit of FIG. 6 according to an embodiment.

FIG. 7 more particularly illustrates with detail the GSM band and shows that, surprisingly, it is even possible, by properly controlling the control voltages Vc1 and Vc2, to directly provide selection of one specific channel within the GSM band thanks to the steep slope of the transfer function.

Figure 8:
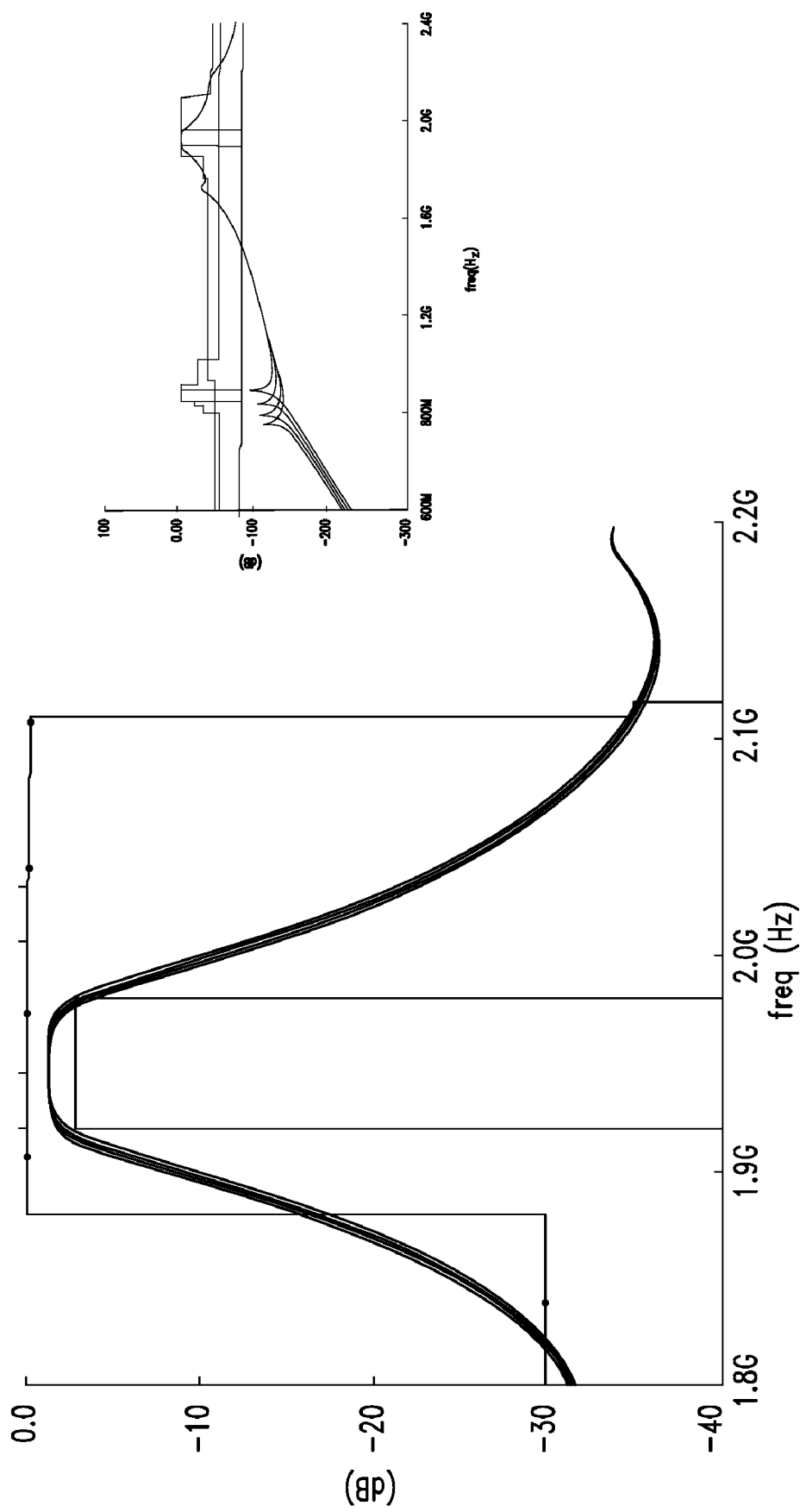
FIG. 8 more particularly illustrates the detail of the second pass band (DCS) of the filtering circuit of FIG. 6 according to an embodiment.

FIG. 8 more particularly illustrates with detail the band DCS which correspond to the second neighborhood of second and fourth resonant frequencies f2 and f4 of impedances Zs and Zp. It can be seen that it is possible to achieve, in a simple way, a band filter which characteristics can be precisely tuned in order to comply with the requirements of the standard.

With one embodiment of the invention, there is also achieved a wide variety of filtering circuits.

Indeed, a second embodiment of the invention provides a filtering circuit which simultaneously comply with the WCDMA standard operating at 850 Mhz and WCDMA operating at 2.14 Ghz.

In a third embodiment of the invention, there is provided a filtering circuit which achieves both BLUETOOTH at 2.45 GHz and GPS at 1.5 GHz.

Figure 9:
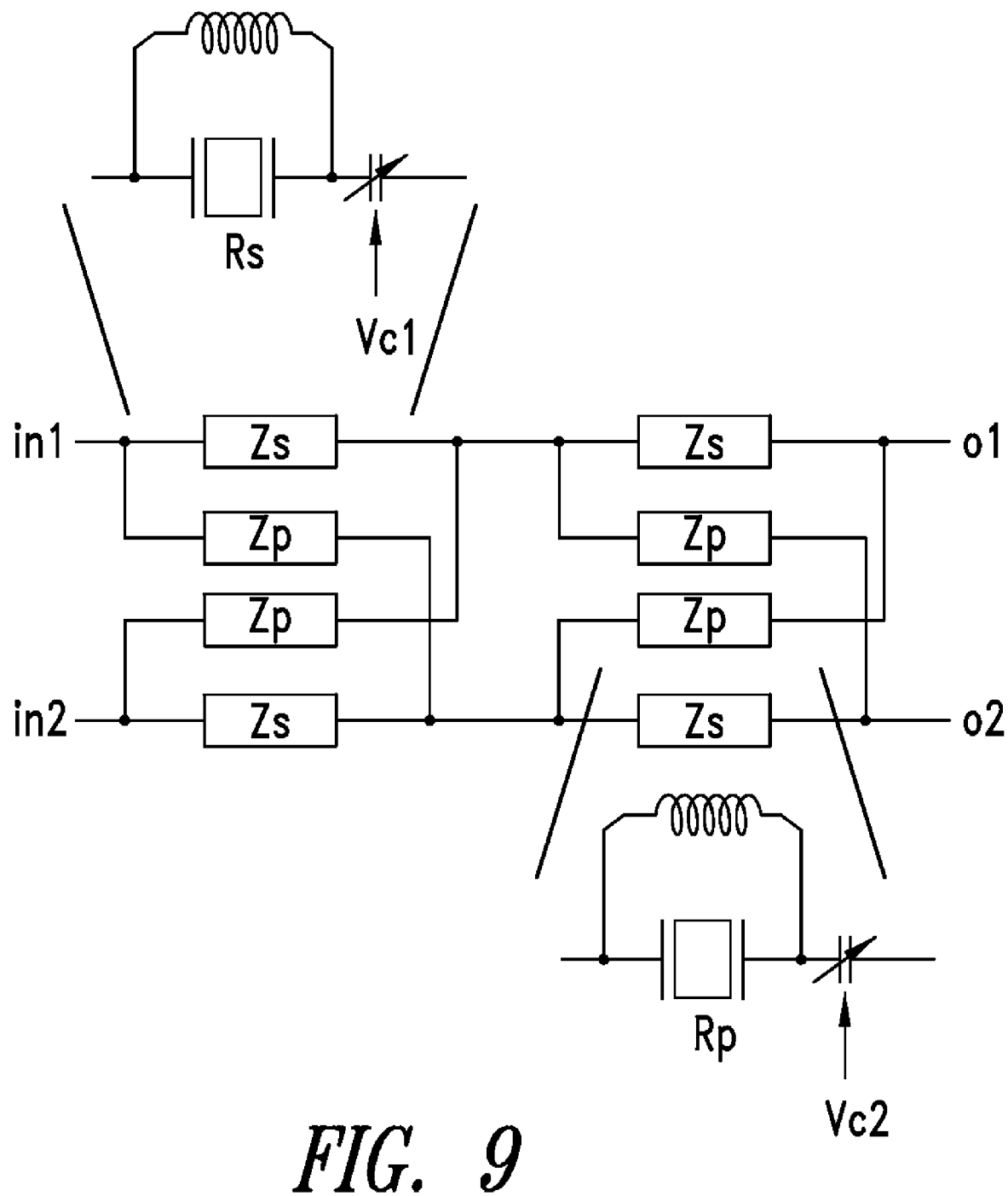
FIG. 9 illustrates an embodiment of the present invention comprising two lattice quadripoles connected in lattice.

FIG. 9 illustrates another embodiment of a filtering circuit of the present invention which comprises, in cascade, two lattice filtering structures such as described above. Clearly, the circuit which was described can be adapted in order to carry out multiple applications such as first and second generation mobile telecommunications and, more generally, to transmission and receiving circuits.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, Abstract, and the claims, but should be construed to include all possible embodiments along with the full scope of equivalents to which such claims are entitled. Accordingly, the claims are not limited by the disclosure.

What is claimed is:

1. A filtering circuit based on a lattice structure having first and second inputs and first and second outputs, said filtering circuit comprising:
    a first impedance coupled between said first input and said first output;
    a second impedance coupled between said second input and said second output;
    a third impedance coupled between said first input and said second output;
    a fourth impedance coupled between said second input and said first output;
    said first and third impedances each including an acoustic resonator associated with two components, respectively inductive and capacitive and adjustable by a first control value;
    said second and fourth impedance each including an acoustic resonator associated with two components, respectively inductive and capacitive, and adjustable by a second control value; and
    a circuit to generate said first and second control values with both common mode and differential mode, which provides at least a first band pass and a second band pass.

2. The filtering circuit according to claim 1 wherein said second band pass is located at a range of frequencies being half a range of the first band pass.

3. The filtering circuit according to claim 1 wherein said acoustic resonator of each of said first, second, third and fourth impedances includes a BAW type resonator coupled in parallel with said associated inductive component, which is an inductor, and wherein each of said parallel coupled BAW type resonator and inductor being coupled in series with said associated capacitive component, which is a varactor that can be tuned by respective said first or second control values, which is a control voltage.

4. The filtering circuit according to claim 1 wherein said acoustic resonator of each of said first, second, third and fourth impedances includes a BAW type resonator coupled in series with said associated inductive component, which is an inductor, and wherein each of said series coupled BAW type resonator and inductor being coupled in parallel with said associated capacitive component, which is a varactor adjustable by respective said first or second control values, which is a control voltage.

5. The filtering circuit according to claim 1 wherein said first pass band corresponds to one channel of a GSM band and wherein said second pass band corresponds to a DCS band.

6. The filtering circuit according to claim 5 wherein said first and second control values are generated so as to cause selection of the GMS-GSM channel within said first band.

7. The filtering circuit according to claim 1 wherein said first band corresponds to part of a WCDMA band operating at 850 MHz and wherein said second band corresponds to a WCDMA standard at 2.14 Ghz.

8. The filtering circuit according to claim 1 wherein said first band corresponds to a GPS standard operating at 1.5 Ghz.

9. A mobile telephone, comprising:
    a transmitter; and
    a receiver including a filter circuit based on a lattice structure having first and second inputs and first and second outputs, said circuit further having:
        a first impedance coupled between said first input and said first output;
        a second impedance coupled between said second and said second output;
        a third impedance coupled between said first input and said second output;
        a fourth impedance coupled between said second input and said first output;
        said first and third impedances each including an acoustic resonator associated with two components, respectively inductive and capacitive and adjustable by a first control value;
        said second and fourth impedance each including an acoustic resonator associated with two components, respectively inductive and capacitive and adjustable by a second control value; and a circuit to generate said first and second control values with both common mode and differential mode, which provides at least a first band pass and a second band pass.

10. The mobile telephone according to claim 9 wherein each said acoustic resonator of said first, second, third and fourth impedances includes a BAW type resonator coupled in series with said associated inductive component, which is an inductor, and wherein each of said series coupled BAW type resonator and inductor being coupled in parallel with said associated capacitive component, which is a varactor that can be tuned by respective said first or second control values, which is a control voltage.

11. The mobile telephone of claim 9 wherein said acoustic resonator of each of said first, second, third and fourth impedances includes a BAW type resonator coupled in parallel with said associated inductive component, which is an inductor, and wherein each of said parallel coupled BAW type resonator and inductor being coupled in series with said associated capacitive component, which is a varactor that can be tuned by respective said first or second control values, which is a control voltage.

12. An apparatus, comprising:
first and second input terminals;
first and second output terminals;
a first resonator circuit coupled between said first input terminal and said first output terminal;
a second resonator circuit coupled between said second input terminal and said second output terminal;
a third resonator circuit coupled between said first input terminal and said second output terminal;
a fourth resonator circuit coupled between said second input terminal and said first output terminal;
wherein said first and third resonator circuits each include an acoustic resonator associated with an inductive component and a capacitive component, and are adjustable by a first control value;
wherein said second and fourth resonator circuits each include an acoustic resonator associated with an inductive component and a capacitive component, and are adjustable by a second control value; and
a control circuit coupled to said first, second, third, and fourth resonator circuits to generate said first and second control values with both common mode and differential mode to correspondingly cause said resonator circuits to provide at least a first band pass and a second band pass.

13. The apparatus of claim 12 wherein said acoustic resonators are BAW type resonators.

14. The apparatus of claim 12 wherein at least one of said acoustic resonators is coupled in parallel with its said associated inductive component, said parallel coupled at least one acoustic resonator and its said associated inductive component together being coupled in series with said capacitive component associated with said at least one acoustic resonator, wherein said first or second control value corresponding to said at least one acoustic resonator is applied to said capacitive component associated with said at least one acoustic resonator.

15. The apparatus of claim 12 wherein at least one of said acoustic resonators is coupled in series with its said associated inductive component, said series coupled at least one acoustic resonator and its said associated inductive component together being coupled in parallel with said capacitive component associated with said at least one acoustic resonator, wherein said first or second control value corresponding to said at least one acoustic resonator is applied to said capacitive component associated with said at least one acoustic resonator.

16. The apparatus of claim 12 wherein a differential mode value is added to said first or second control values, which are applied to corresponding ones of each of said capacitive components.

17. The apparatus of claim 12 wherein said first and second input terminals, said first and second output terminals, and said first, second, third, and fourth resonator circuits comprise part of a first filter circuit, the apparatus further comprising:
a second filter circuit, having elements similarly arranged as said first filter circuit, coupled in cascade with said first filter circuit.

18. A method for a filter circuit having an arrangement of first, second, third, and fourth resonator circuits each having an acoustic resonator associated with an inductive component and with a capacitive component, the method comprising:
generating a first control value;
applying said first control value to said first and third resonator circuits;
generating a second control value;
applying said second control value to said second and fourth resonator circuits; and
generating a differential mode value and providing said generated differential mode value along with said applied first and second control values to cause said filter circuit to provide at least a first band pass and a second band pass.

19. The method of claim 18 wherein said applying of the first and second control values includes applying said first and second control values to corresponding ones of said associated capacitor.

20. The method of claim 18 wherein said acoustic resonator is a BAW type acoustic resonator.

21. The method of claim 18 wherein said filter circuit is a first filter circuit, the method further comprising providing an output of said first filter circuit an input to a second filter circuit, said second filter circuit having resonator circuits having similar elements as said first filter circuit.

22. An apparatus, comprising:
first and second input terminals;
first and second output terminals;
a first resonator circuit coupled between said first input terminal and said first output terminal;
a second resonator circuit coupled between said second input terminal and said second output terminal;
a third resonator circuit coupled between said first input terminal and said second output terminal;
a fourth resonator circuit coupled between said second input terminal and said first output terminal;
wherein said first and third resonator circuits each include an acoustic resonator associated with an inductive component and a capacitive component, and are adjustable by a first control value;
wherein said second and fourth resonator circuits each include an acoustic resonator associated with an inductive component and a capacitive component, and are adjustable by a second control value; and
a control circuit coupled to said first, second, third, and fourth resonator circuits to generate said first and second control values to correspondingly cause said resonator circuits to provide at least a first band pass and a second band pass,
wherein at least one of said acoustic resonators is coupled in series with its said associated inductive component, said series coupled at least one acoustic resonator and its said associated inductive component together being coupled in parallel with said capacitive component associated with said at least one acoustic resonator, wherein said first or second control value corresponding to said at least one acoustic resonator is applied to said capacitive component associated with said at least one acoustic resonator, wherein a differential mode value is added to said first or second control values, which are applied to corresponding ones of each of said capacitive components.

23. The apparatus of claim 22 wherein said first and second input terminals, said first and second output terminals, and said first, second, third, and fourth resonator circuits comprise part of a first filter circuit, the apparatus further comprising:
a second filter circuit, having elements similarly arranged as said first filter circuit, coupled in cascade with said first filter circuit.

24. An apparatus, comprising:
first and second input terminals;
first and second output terminals;
a first resonator circuit coupled between said first input terminal and said first output terminal;
a second resonator circuit coupled between said second input terminal and said second output terminal;
a third resonator circuit coupled between said first input terminal and said second output terminal;
a fourth resonator circuit coupled between said second input terminal and said first output terminal;
wherein said first and third resonator circuits each include an acoustic resonator associated with an inductive component and a capacitive component, and are adjustable by a first control value;
wherein said second and fourth resonator circuits each include an acoustic resonator associated with an inductive component and a capacitive component, and are adjustable by a second control value; and
a control circuit coupled to said first, second, third, and fourth resonator circuits to generate said first and second control values to correspondingly cause said resonator circuits to provide at least a first band pass and a second band pass,
wherein a differential mode value is added to said first or second control values, which are applied to corresponding ones of each of said capacitive components.

25. The apparatus of claim 24 wherein said first and second input terminals, said first and second output terminals, and said first, second, third, and fourth resonator circuits comprise part of a first filter circuit, the apparatus further comprising:
a second filter circuit, having elements similarly arranged as said first filter circuit, coupled in cascade with said first filter circuit.

26. The apparatus of claim 24 wherein at least one of said acoustic resonators is coupled in parallel with its said associated inductive component, said parallel coupled at least one acoustic resonator and its said associated inductive component together being coupled in series with said capacitive component associated with said at least one acoustic resonator, wherein said first or second control value corresponding to said at least one acoustic resonator is applied to said capacitive component associated with said at least one acoustic resonator.

27. The apparatus of claim 24 wherein at least one of said acoustic resonators is coupled in series with its said associated inductive component, said series coupled at least one acoustic resonator and its said associated inductive component together being coupled in parallel with said capacitive component associated with said at least one acoustic resonator, wherein said first or second control value corresponding to said at least one acoustic resonator is applied to said capacitive component associated with said at least one acoustic resonator.

* * * * *